US006600336B2

(12) United States Patent
Kojima

(10) Patent No.: US 6,600,336 B2
(45) Date of Patent: Jul. 29, 2003

(54) SIGNAL TRANSMISSION SYSTEM

(75) Inventor: Makoto Kojima, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 119 days.

(21) Appl. No.: 09/918,797

(22) Filed: Aug. 1, 2001

(65) Prior Publication Data

US 2002/0015334 A1 Feb. 7, 2002

(30) Foreign Application Priority Data

Aug. 3, 2000 (JP) ........................................ 2000-235465

(51) Int. Cl.[7] ............................................... H03K 17/16
(52) U.S. Cl. .............................. 326/31; 326/27; 326/82
(58) Field of Search .............................. 326/82–87, 30, 326/31, 26, 27

(56) References Cited

U.S. PATENT DOCUMENTS 4,670,666 A    6/1987  Yoshida
6,366,130 B1 * 4/2002  Podlesny et al. .............. 326/95
6,377,512 B1 * 4/2002  Hamamoto et al. ......... 365/233

FOREIGN PATENT DOCUMENTS

JP          09-244776        9/1997

* cited by examiner

*Primary Examiner*—Don Le
(74) *Attorney, Agent, or Firm*—McDermott, Will & Emery

(57) ABSTRACT

A bus made up of a plurality of lines is interposed between a driver circuit on the transmitting end and a receiver circuit on the receiving end. An equalizer circuit includes multiple CMOS switches, each of which is connected between two adjacent ones of the bus lines. In changing data to be transmitted through the bus lines, first, the outputs of tristate buffers on the transmitting end should have high impedance and input buffers on the receiving end should be deactivated. Then, an equalize (EQ) signal is asserted, thereby activating the equalizer circuit. While the potential levels on the bus lines are being equalized, these bus lines are all electrically disconnected from a power supply. After the potential levels on the bus lines have been equalized in this manner, the EQ signal is negated and then normal signal transmission is carried out.

21 Claims, 16 Drawing Sheets

SIGNAL TRANSMISSION SYSTEM

BACKGROUND OF THE INVENTION

The present invention relates to a signal transmission system effectively applicable to a system LSI, for example.

Recently, to enhance the performance of a system LSI, the index of parallelism, not the clock frequency, of the LSI is increased more and more often. For example, in handling multimedia-related data (i.e., audiovisual data including pictures or music), multiple circuits may be laid out in parallel with each other and coupled to a bus with an increased width, thereby processing the data in parallel and increasing the substantial computation rate. The bus width may also be increased to compensate for the low operating speed of a memory (e.g., a built-in DRAM) for storing the data thereon and thereby increase the effective data transfer rate. For that purpose, a data bus with as broad a width as 4096 bits is sometimes used. However, when data is transferred from a certain block to another by way of a bus of such a broad width, a huge quantity of power is dissipated on the signal lines included in the bus (which will be herein referred to as "bus lines").

Hereinafter, it will be estimated with reference to FIGS. 16 through 18 how much power is dissipated on an 8-bit bus.

FIG. 16 schematically illustrates stray capacitances Ch and Cv, associated with bus lines for a known signal transmission system, as a cross section of a semiconductor substrate. In the illustrated example, an 8-bit bus is made up of eight bus lines B[7] through B[0] that are equally spaced apart from each other horizontally. As shown in FIG. 16, two ground lines GND are laid out on the right- and left-hand sides of the bus lines B[0] and B[7], respectively, and are also equally spaced apart horizontally therefrom. The space S between two adjacent ones of the bus lines B[7] through B[0] is supposed to be equal to the space S between the ground line GND and the bus line B[7] or B[0]. Furthermore, in the example illustrated in FIG. 16, these bus lines B[7] through B[0] and ground lines GND have a thickness T1 and are vertically spaced apart from their underlying structure (which may be either substrate or lower-level interconnect but which is shown as GND in the example illustrated in FIG. 16) by a distance T2. The distance T2 is actually equal to the thickness of an interlevel film existing between the bus lines B[7] through B[0] or ground lines GND and the underlying structure. The bus lines B[7] through B[0] and ground lines GND with a width L are arranged at regular pitches P and are horizontally spaced apart from each other by the space S. For example, T1=T2=1,000 nm, P=1.0 $\mu$m, L=0.26 $\mu$m and S=0.74 $\mu$m. According to the 0.18 $\mu$m design rule, the line space S can be decreased down to about 0.2 $\mu$m. In the illustrated example, however, the line space S is intentionally increased more than threefold to 0.74 $\mu$m to minimize the stray capacitance Ch between two adjacent bus lines. In FIG. 16, Ch denotes a horizontal stray capacitance created between a given bus line and a horizontally adjacent bus or ground line, while Cv denotes a vertical stray capacitance created between a given bus line and the underlying structure.

If the capacitance associated with a line of a length of 4 mm is calculated by a boundary element method, the capacitance associated with the line per unit length (e.g., 1 mm) will be: Ch=0.090 pF/mm and Cv=0.025 pF/mm. Accordingly, even if the line space S is more than three times as long as the minimum value thereof, the horizontal components (i.e., 2×Ch, because two horizontal stray capacitances Ch exist on right- and left-hand sides of each bus line) account for almost all (i.e., 88% in this example) of the total capacitance (i.e., 2×Ch+Cv including the vertical component).

Next, it will be described with reference to FIGS. 17 and 18 how charges are stored on each stray capacitance where 8-bit data words "AA" and "55" (which are both hexadecimal representations) are alternately transferred through the bus lines B[7] through B[0]. In each of these patterns (or data words), every adjacent pair of bits has mutually opposite values (i.e., "01" or "10"). Also, the respective bits making up the pattern "AA" are inverse of the counterparts making up the other pattern "55". Specifically, FIG. 17 illustrates how charges are stored during the transmission of the data pattern "AA", while FIG. 18 illustrates how charges are stored during the transmission of the data pattern "55".

In the example illustrated in FIG. 17 for the data pattern "AA", two adjacent charges stored on each horizontal capacitance Ch have mutually opposite polarities. However, no charges have been stored on the capacitance Ch between the bus line B[0], representing the least significant bit (LSB), and the ground GND on the right-hand side of the bus line B[0] because these lines are at the same potential level. In FIG. 17, voltages are applied so that the two lines, adjacent to the rightmost and leftmost ones of the eight bus lines B[7] through B[0], and the underlying structure are grounded, and the charges stored have all been supplied from bus drivers. Over the respective bus lines B[7] through B[0], shown are the quantities Q1 and Q2 of charges that were supplied from a power supply when the previous data pattern "55" was replaced with this data pattern "AA". Q1 represents the quantity of charges stored in a capacitance between two adjacent bus lines and Q2 represents the quantity of charges stored elsewhere as will be described in detail later. As for the vertical capacitances Cv on the other hand, charges have been stored, first, on the capacitance Cv associated with the bus line B[7] representing the most significant bit (MSB), and then on every other bit basis. That is to say, in the example illustrated in FIG. 17, the charges have been stored on only the "1" bits of the data pattern "AA".

Suppose the data to be transferred has changed from the pattern "AA" shown in FIG. 17 into the pattern "55" shown in FIG. 18. In that case, each of the charges stored on every horizontal capacitance Ch between two adjacent bus lines has the same absolute value but the opposite polarity compared to the situation shown in FIG. 17. However, the horizontal capacitance Ch between the leftmost bus line B[7] and the ground GND and the vertical capacitance Cv between the bus line B[7] and the ground GND have been discharged to lose the charges. On the other hand, the horizontal capacitance Ch between the rightmost bus line B[0] and the ground GND and the vertical capacitance Cv between the bus line B[0] and the ground GND have been charged with a current supplied from the bus driver to gain the charges. It should be noted that any capacitance is dischargeable with no current supplied from the power supply.

The charges are stored in this manner for the respective data patterns. Next, it will be described how much charging current flows from the power supply. It should be noted that the supply voltage is supposed to be 1 V for the sake of simplicity.

First, the quantity Q1 of charges stored on each capacitance Ch between two adjacent bus lines where the patterns "AA" and "55" are transmitted alternately will be considered. For example, on the horizontal capacitance Ch between the two adjacent bus lines B[7] and B[6], a charge quantity Ch×1 V (with positive charges located on the right-hand side) is stored during the transmission of the pattern "55" as shown in FIG. 18, while a charge quantity Ch×1 V (with positive charges located on the left-hand side) is stored during the transmission of the pattern "AA" as shown in FIG. 17. To change the charge quantities this way, the bus driver should supply charges in a quantity of 2×Ch×1 V to the bus line B[7] before a pair of these complementary patterns is transmitted once successfully. The second leftmost bus line B[6] is sandwiched between the bus lines B[7] and B[5] that change their logical states alternately. Accordingly, the bus line B[6] should be supplied with twice the quantity of charges. Consequently, the total quantity of charges supplied from the power supply to the capacitances Ch between the adjacent bus lines while those two patterns are transmitted once (i.e., during two data transfer cycles) is $\{(8-1)\times(2\times 2Ch)\}\times 1$ V.

Next, the quantity Q2 of charges stored elsewhere (i.e., not between two adjacent bus lines) where the pattern transmitted changes from "AA" into "55", or vice versa, will be described. As for the bus line B[7], for example, a voltage of 0 V is applied to, and a charge quantity of 0 is stored on, the vertical capacitance Cv during the transmission of the pattern "55" as shown in FIG. 18. On the other hand, during the transmission of the pattern "AA" as shown in FIG. 17, a voltage of 1 V is applied to, and a charge quantity of Cv is stored on, the vertical capacitance Cv thereof. Regarding this bus line B[7], a voltage of 0 V is applied to, and a charge quantity of 0 is stored on, the horizontal capacitance Ch between this line B[7] and the ground GND during the transmission of the pattern "55" as shown in FIG. 18. On the other hand, during the transmission of the pattern "AA" as shown in FIG. 17, a voltage of 1 V is applied to, and a charge quantity of Ch is stored on, the horizontal capacitance Ch thereof. That is to say, as for the bus line B[7], a charge quantity (Cv+Ch)×1 V is supplied from the power supply to, and then discharged from, the capacitance created elsewhere (or not between the bus lines) while the data patterns transmitted make one round in the order of "AA"→"55"→"AA". The same statement is applicable to the vertical capacitance Cv associated with any other bus line and to the horizontal capacitance Ch between the rightmost bus line B[0] and the ground GND, because one of the two electrodes of the capacitance Cv or Ch has a fixed potential level. Consequently, the total quantity of charges supplied from the power supply while the data patterns transmitted make one round (i.e., during two data transfer cycles) is (8×Cv+2Ch)×1 V.

The foregoing example relates to a bus with a width of 8 bits. But the amount of current dissipated from, or charged to, bus lines where two alternating data patterns are transmitted is generalized with respect to a bit width N (which is an integer equal to or greater than 3) as follows:

Current dissipated from bus lines $=\{N\times Cv/2+Ch+(N-1)\times 2\times Ch\}\times VDD\times 1/T$ $\approx (N\times Cv/2+N\times 2Ch)\times VDD\times 1/T$ (1)

where T is the signal transfer period and VDD is the voltage of a positive power supply. In Equation (1), N×Cv/2+Ch is a term representing a capacitance associated with the electrode with a fixed potential, (N−1)×2×Ch is a term representing a capacitance between two adjacent bus lines, N×Cv/2 represents the total vertical capacitance and N×2Ch represents the total horizontal capacitance.

Suppose an N-bit bus should have its capacitances estimated and simulated. In that case, it is normally unknown what types of lines are adjacent to the bus lines or when the lines are activated or deactivated. Accordingly, the capacitance associated with one of those adjacent lines (i.e., 2×Ch in the foregoing example) is estimated as a relative capacitance determined with respect to GND. According to this approach, Current dissipated from bus lines $=\{N\times (Cv+2Ch)/2\}\times VDD\times 1/T$ $=(N\times Cv/2+N\times Ch)\times VDD\times 1/T$ (2)

where N×(Cv+2Ch)/2 is a term representing a capacitance associated with the electrode with a fixed potential, N×Cv/2 represents the total vertical capacitance and N×Ch represents the total horizontal capacitance. Thus, it can be seen that the horizontal capacitance Ch contributes in Equation (1) almost twice as greatly as in Equation (2).

That is to say, a bus line, adjacent to a given bus line, cannot be regarded as an electrode with a fixed potential. Rather it is determined, depending on how the potential level on the adjacent bus line changes relative to the given bus line, how much load capacitance the adjacent bus line constitutes. In the foregoing example where the patterns "AA" and "55" are transmitted alternately, the potential levels on the adjacent and given bus lines change in mutually opposite phases. Accordingly, the horizontal capacitance Ch looks as if the capacitance constituted twice-greater load capacitance. Also, where the adjacent line is an electrode with a fixed potential (e.g., between the bus line B[7] representing the MSB and GND), the horizontal capacitance Ch looks like 1x load capacitance. Furthermore, although not described in detail, where the potential levels on the given and adjacent bus lines change in phase, the horizontal capacitance Ch looks like 0x load capacitance.

Thus, it can be seen that the power dissipated from bus lines increases proportionally to the bit width N. It can also be seen that the greater the number of bit pairs each changing into mutually opposite values, the greater the power dissipated.

A technique applicable to a signal transmission system for transmitting a signal at a high rate through a bus is disclosed in Japanese Laid-Open Publication No. 9-244776. According to the technique, a signal can be transmitted with its amplitude decreased by preventing any signal potential from increasing excessively due to the existence of a coupling capacitance (i.e., stray capacitance) between adjacent bus lines. This technique supposes that a bus line should be driven by a driver circuit after having been precharged to a predetermined level. For that purpose, an equalizing MOS transistor is interposed between adjacent bus lines. The equalizing MOS transistor is turned on during a precharge interval to shortcircuit the adjacent bus lines together. That is to say, to prevent any signal potential from increasing too much due to the existence of the stray capacitance, the bus lines are precharged to VDD/2 (where VDD is the supply voltage) and then the potentials on the lines are equalized supplementally. However, if VDD is as low as 1.6 V or less, then VDD/2 is 0.8 V or less, which is very close to the threshold voltage of the transistor. But it is difficult to make a power supply that can supply that low voltage of VDD/2 while maintaining sufficient ability thereof.

SUMMARY OF THE INVENTION

It is therefore an object of the present invention to reduce the power dissipated from bus lines in a signal transmission system.

To achieve this object, a signal transmission system according to the present invention includes: driver circuit on the transmitting end; receiver circuit on the receiving end; three or more bus lines interposed between the driver and receiver circuits; and equalizer circuit. The equalizer circuit equalizes potential levels on the bus lines with each other while the bus lines are electrically disconnected from a power supply before a signal is transmitted by way of the bus lines. Every time a system with such a configuration transmits a signal, the system can remove the charges that have been stored on a stray capacitance between adjacent bus lines without dissipating power, and can also recycle the charges stored. As a result, the power dissipated from the bus lines can be reduced considerably.

Another signal transmission system according to the present invention includes: driver circuit on the transmitting end; receiver circuit on the receiving end; three or more bus lines interposed between the driver and receiver circuits; and reset circuit. The reset circuit resets potential levels on the bus lines to a low level before a signal is transmitted by way of the bus lines. Every time a system with such a configuration transmits a signal, the system can remove the charges that have been stored on a stray capacitance between adjacent bus lines without dissipating power. As a result, the power dissipated from the bus lines can be reduced.

A third signal transmission system according to the present invention includes: driver circuit on the transmitting end; receiver circuit on the receiving end; and three or more bus lines interposed between the driver and receiver circuits. In this system, the bus lines are so arranged as to reduce the number of adjacent bit pairs, each changing into mutually opposite values at a time. Thus, the power dissipated from the bus lines can be reduced.

DETAILED DESCRIPTION OF THE INVENTION

Hereinafter, preferred embodiments of the present invention will be described with reference to the accompanying drawings.

Figure 1:
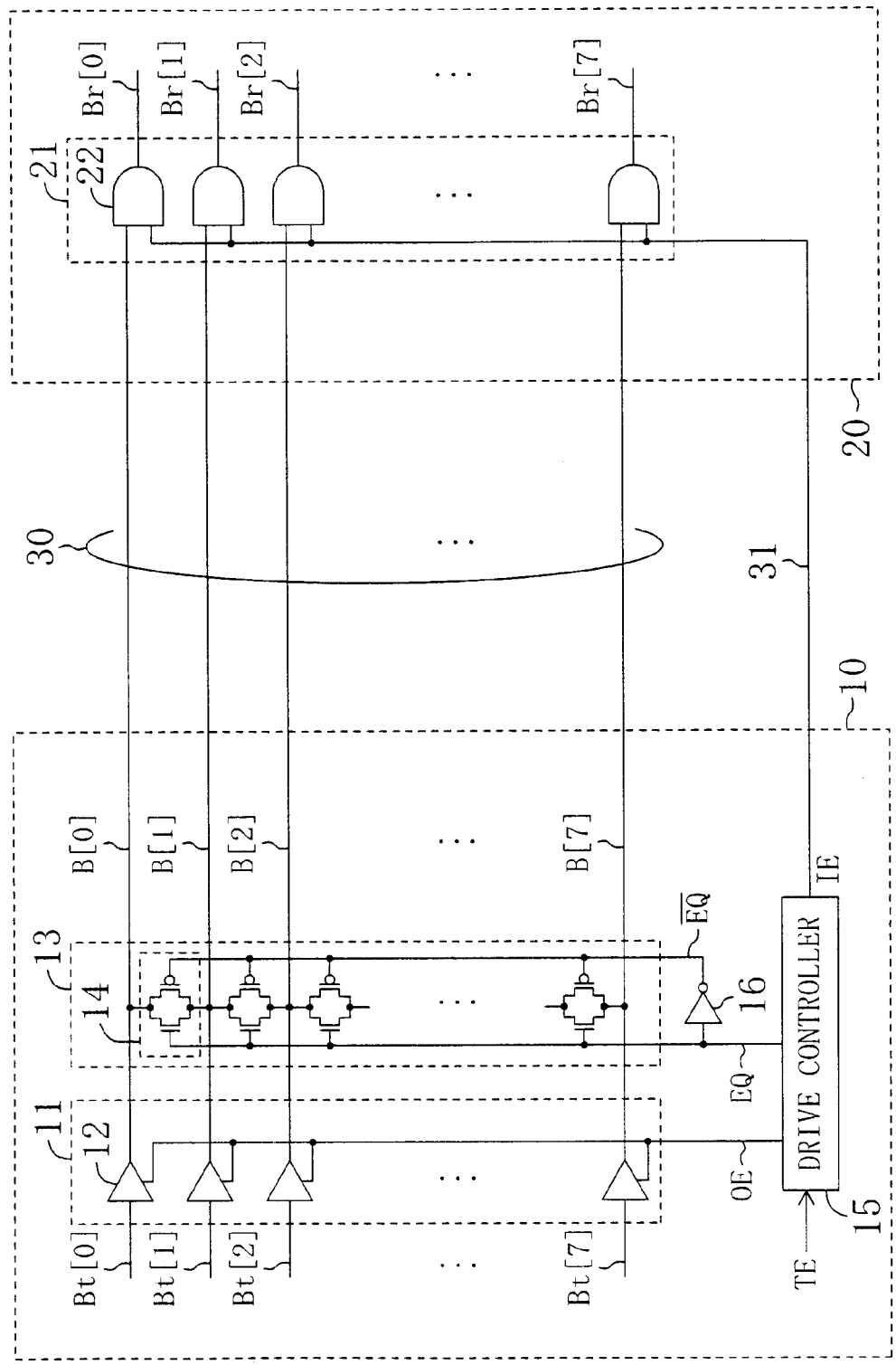
FIG. 1 is a circuit diagram illustrating an exemplary configuration for the signal transmission system of the present invention.

FIG. 1 illustrates an exemplary configuration for the signal transmission system of the present invention. The system shown in FIG. 1 includes: driver circuit 10 on the transmitting end; receiver circuit 20 on the receiving end; and bus 30 interposed between the driver and receiver circuits 10 and 20. In the illustrated embodiment, the bus 30 is made up of eight bus lines B[7] through B[0].

The driver circuit 10 includes bus driver 11, equalizer circuit 13, drive controller 15 and inverter 16. The bus driver 11 is made up of eight tristate buffers 12, which receive an output enable (OE) signal from the drive controller 15 to drive the bus lines B[7] through B[0] in accordance with the data Bt[7] through Bt[0] to be transmitted. Before a signal is transmitted from the driver circuit 10 to the receiver circuit 20 by way of the bus 30, the equalizer circuit 13 equalizes the potential levels on the bus lines B[7] through B[0] with each other while the bus lines B[7] through B[0] are electrically disconnected from a power supply. The equalizer circuit 13 includes seven CMOS switches 14, each being made up of p- and n-channel MOS (i.e., PMOS and NMOS) transistors. Each of these CMOS switches 14 is interposed between two adjacent ones of the bus lines B[7] through B[0]. The switches 14 are controlled responsive to equalize (EQ) and inverted equalize (/EQ) signals supplied from the drive controller 15 and inverter 16, respectively, so as to turn on while the bus lines B[7] through B[0] have their potential levels equalized and to cut off while these bus lines B[7] through B[0] are being driven. In the following description, these two types of intervals will be referred to as "nequalize interval" and "bus drive interval", respectively. On receiving a transmission enable (TE) signal, the drive controller 15 generates not only the OE and EQ signals but also an input enable (IE) signal representing the equalize interval of the bus lines B[7] through B[0]. The system shown in FIG. 1 further includes a control line 31 for transmitting the IE signal from the driver circuit 10 to the receiver circuit 20 therethrough.

To obtain received data Br[7] through Br[0] from the signal that has been transmitted through the bus lines B[7] through B[0], the receiver circuit 20 includes a bus receiver 21 made up of eight input buffers 22. In response to the IE signal supplied through the control line 31, the input buffers 22 are deactivated during the equalize interval of the bus lines B[7] through B[0].

Figure 2:
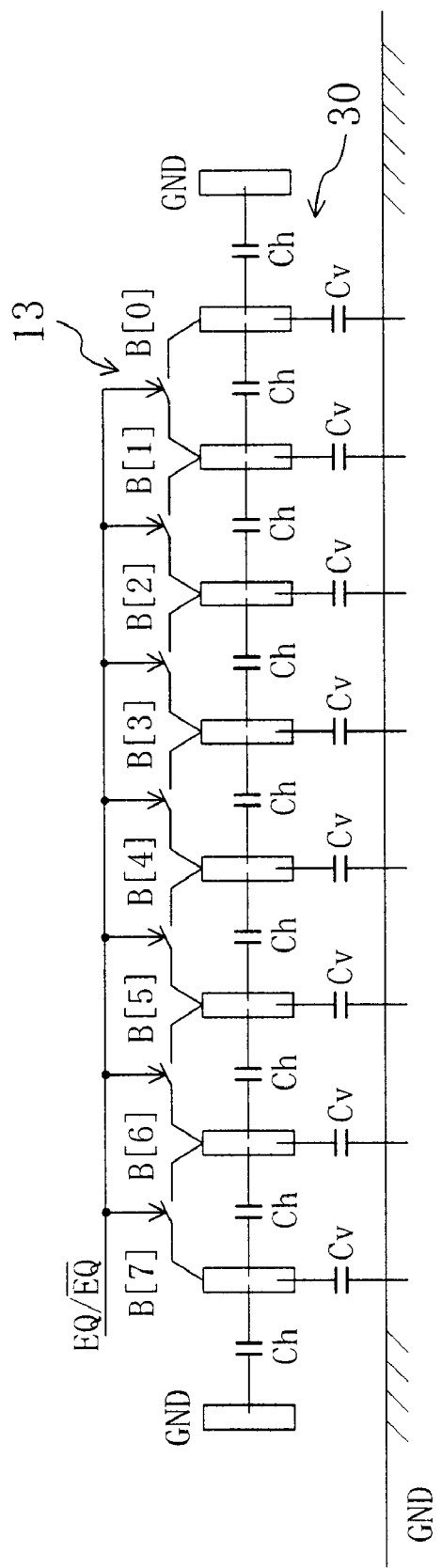
FIG. 2 is a schematic representation illustrating the equalizer circuit and stray capacitances associated with the bus lines shown in FIG. 1.
Figure 16:
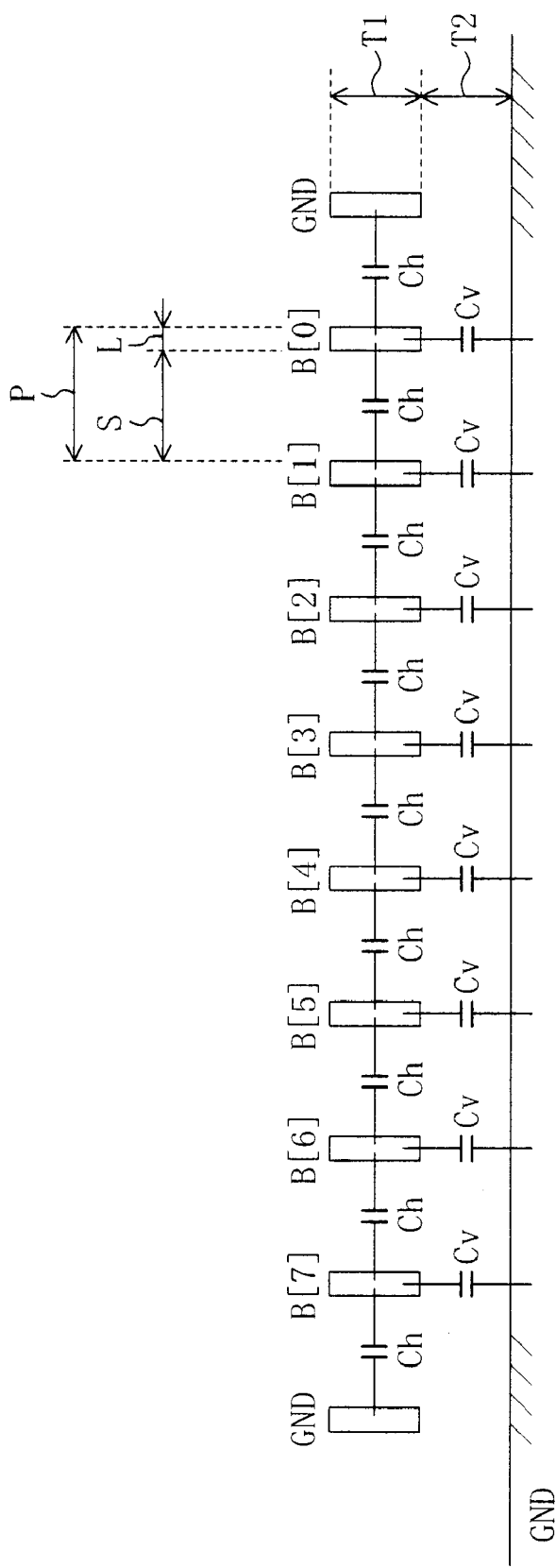
FIG. 16 is a schematic representation illustrating stray capacitances associated with bus lines in a known signal transmission system.

FIG. 2 is a schematic representation illustrating the equalizer circuit 13 and stray capacitances Ch and Cv associated with the bus 30 shown in FIG. 1. As in the example shown in FIG. 16, the 8-bit bus lines B[7] through B[0] and two ground lines GND are also arranged at regular pitches.

Figure 3:
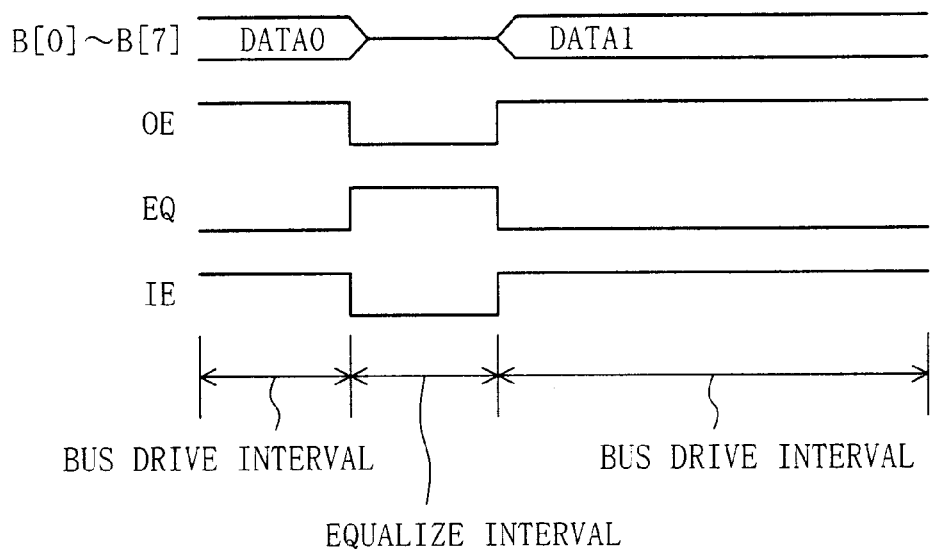
FIG. 3 is a timing diagram illustrating how the system shown in FIG. 1 may operate.

FIG. 3 is a timing diagram illustrating how the system shown in FIG. 1 may operate. As shown in FIG. 3, before the data DATA0 transmitted through the bus lines B[7] through B[0] is replaced with another data DATA1, the OE and IE signals are negated to make the outputs of the tristate buffers 12 on the transmitting end have a high impedance and to deactivate the input buffers 22 on the receiving end. Then, the EQ signal is asserted to activate the equalizer circuit 13. Once the bus lines B[7] through B[0] have their potential levels equalized, the EQ signal will be negated and instead the OE and IE signals will be asserted. Then, the bus lines are ready to be driven and DATA1 is ready to be received.

Figure 4:
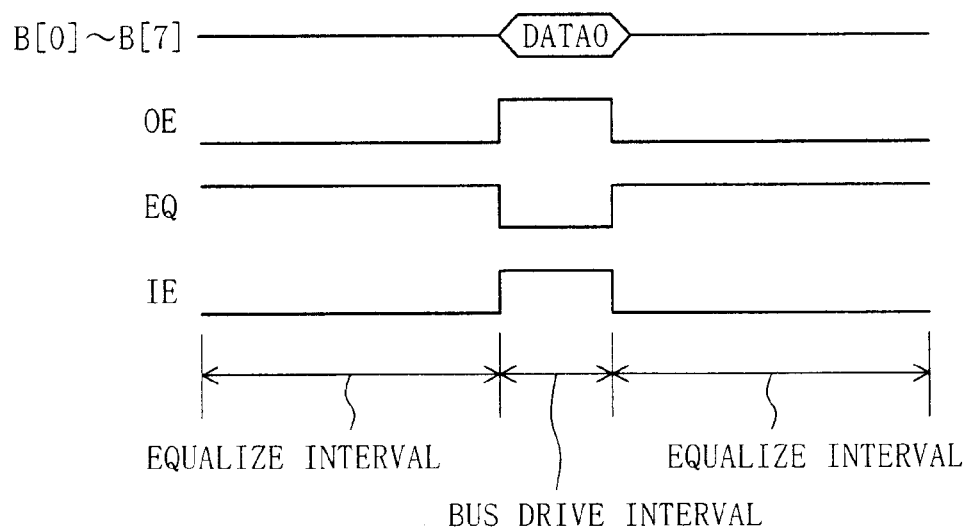
FIG. 4 is a timing diagram illustrating how the system shown in FIG. 1 may also operate.

FIG. 4 is a timing diagram illustrating how the system shown in FIG. 1 may also operate. In the example illustrated in FIG. 4, the bus lines B[7] through B[0] always have their potential levels equalized except while a signal is transmitted through the bus lines B[7] through B[0].

Figure 5:
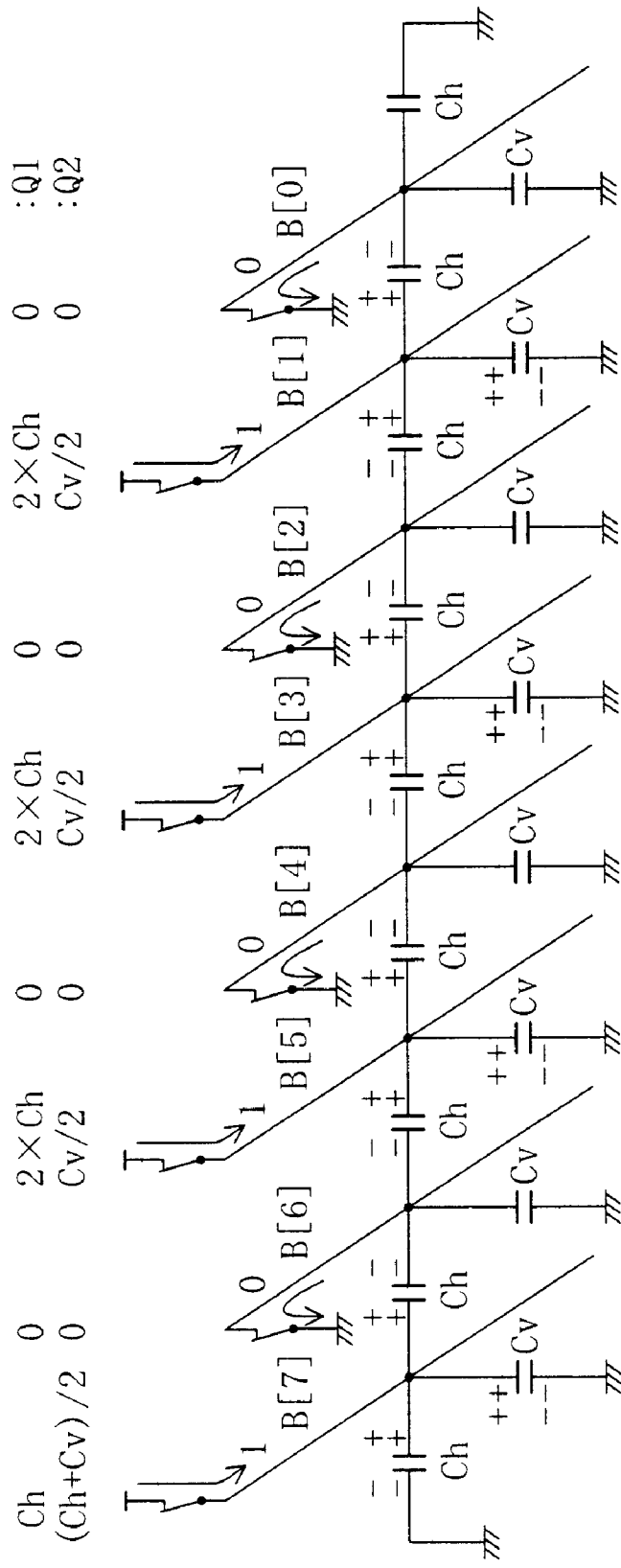
FIG. 5 is a schematic representation illustrating how charges are stored on the stray capacitances shown in FIG. 2 during a bus drive interval for a data pattern "AA".
Figure 6:
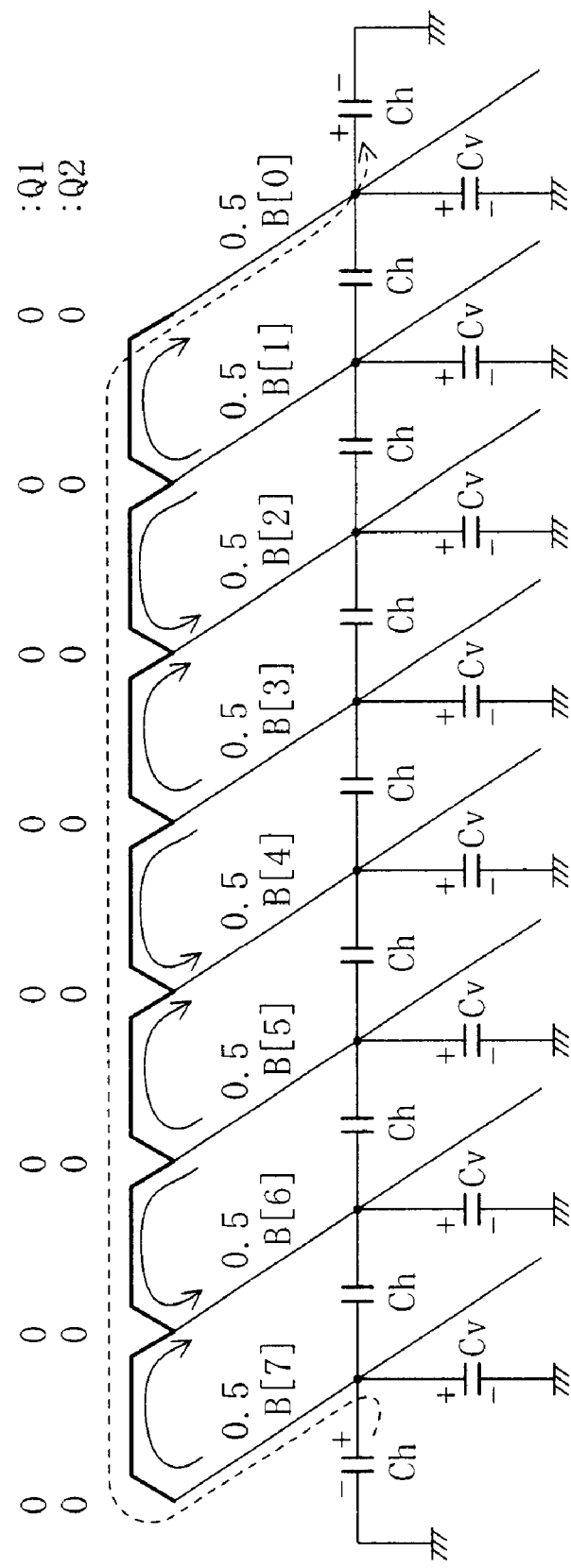
FIG. 6 is a schematic representation illustrating how charges are stored on the stray capacitances shown in FIG. 2 during an equalize interval succeeding the bus drive interval shown in FIG. 5.
Figure 7:
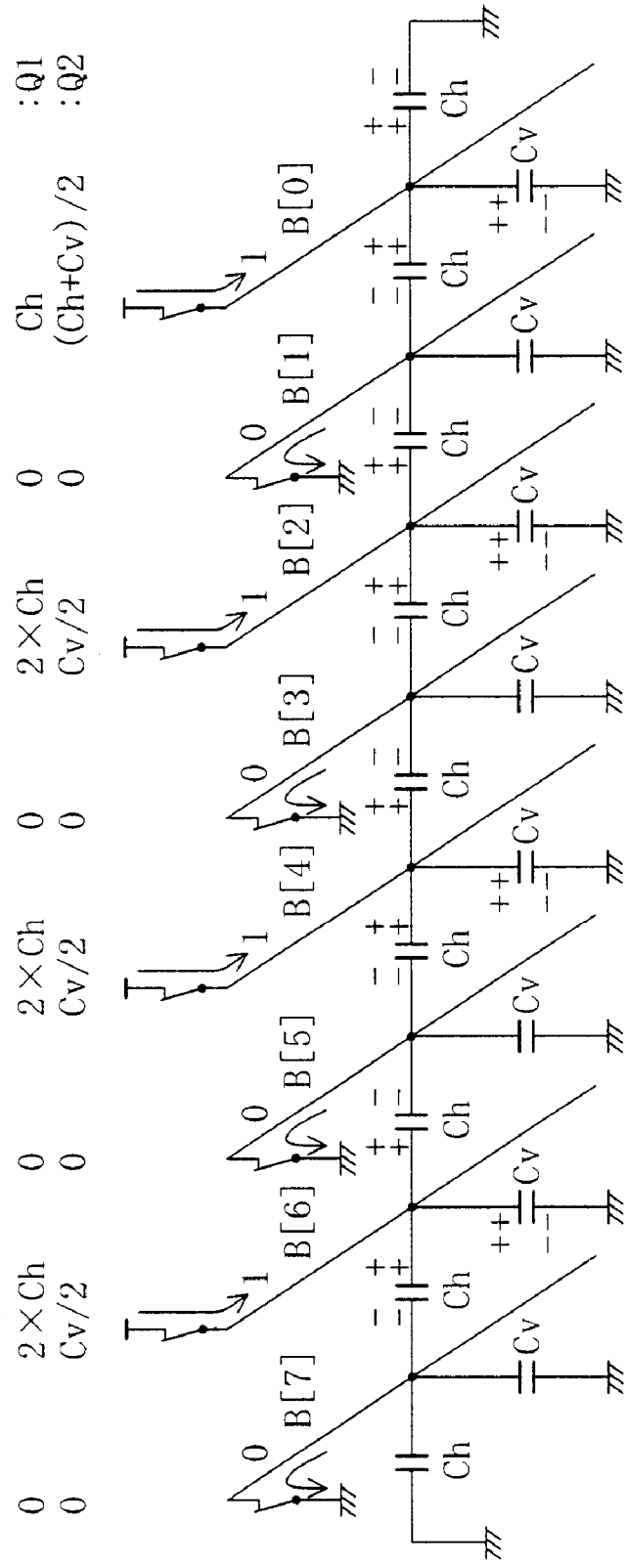
FIG. 7 is a schematic representation illustrating how charges are stored on the stray capacitances shown in FIG. 2 during a bus drive interval for another data pattern "55".
Figure 8:
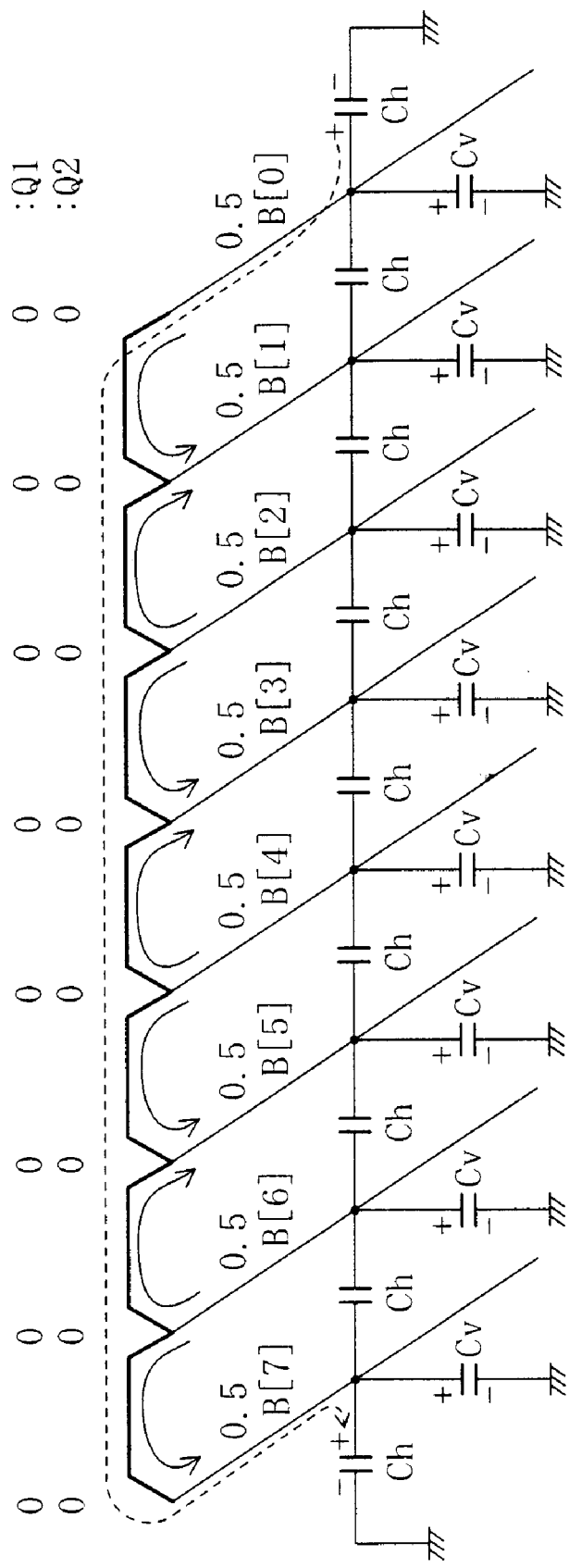
FIG. 8 is a schematic representation illustrating how charges are stored on the stray capacitances shown in FIG. 2 during an equalize interval succeeding the bus drive interval shown in FIG. 7.

Next, it will be described with reference to FIGS. 5 through 8 how charges are stored on respective stray capacitances where 8-bit data words "AA" and "55" (both of which are hexadecimal representations) are alternately transmitted through the bus lines B[7] through B[0]. FIG. 5 illustrates a state during a bus drive interval for a data pattern "AA". FIG. 6 illustrates a state during an equalize interval succeeding the bus drive interval shown in FIG. 5. FIG. 7 illustrates a state during a bus drive interval for another data pattern "55". And FIG. 8 illustrates a state during an equalize interval succeeding the bus drive interval shown in FIG. 7. In FIGS. 5 through 8, Q1 denotes a quantity of charges supplied from a power supply and then stored on a horizontal capacitance between adjacent bus lines, while Q2 denotes a quantity of charges supplied from the power supply and then stored elsewhere. The supply voltage is also supposed to be 1 V for the sake of simplicity.

Figure 17:
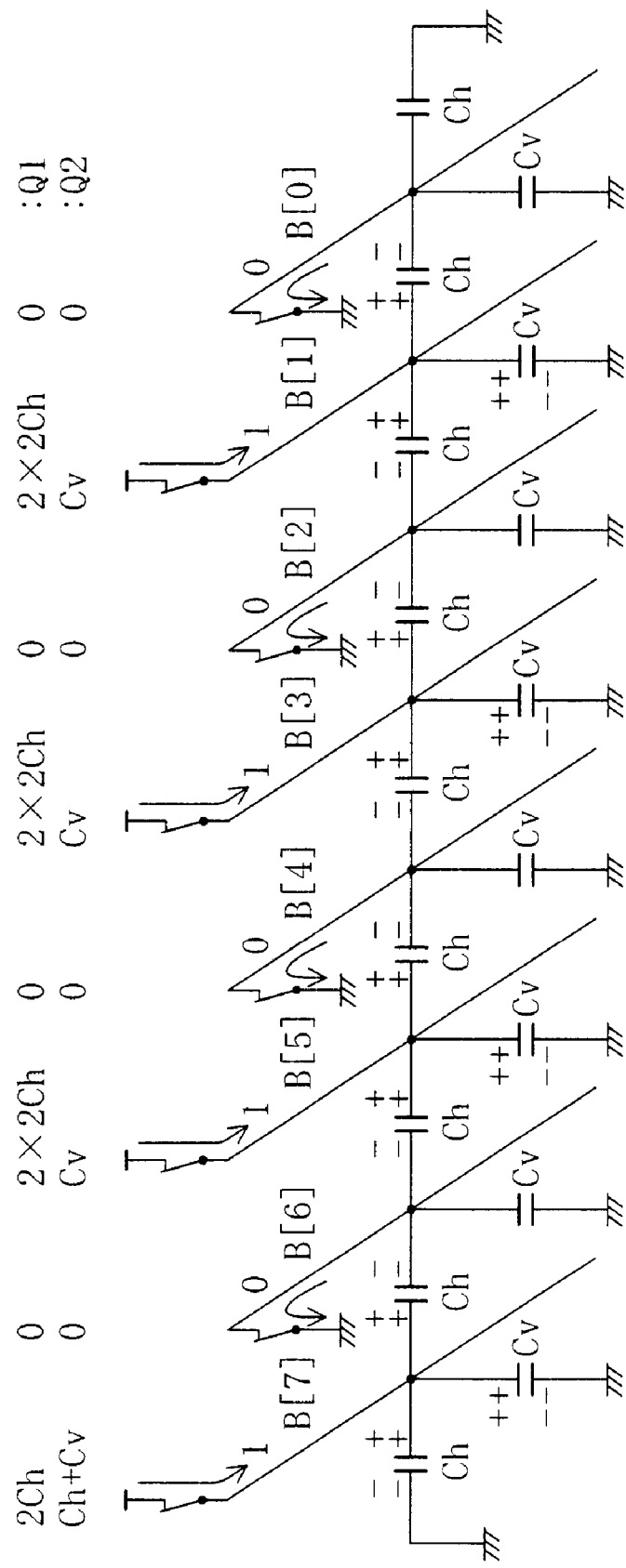
FIG. 17 is a schematic representation illustrating how charges are stored on the stray capacitances shown in FIG. 16 for a data pattern "AA".
Figure 18:
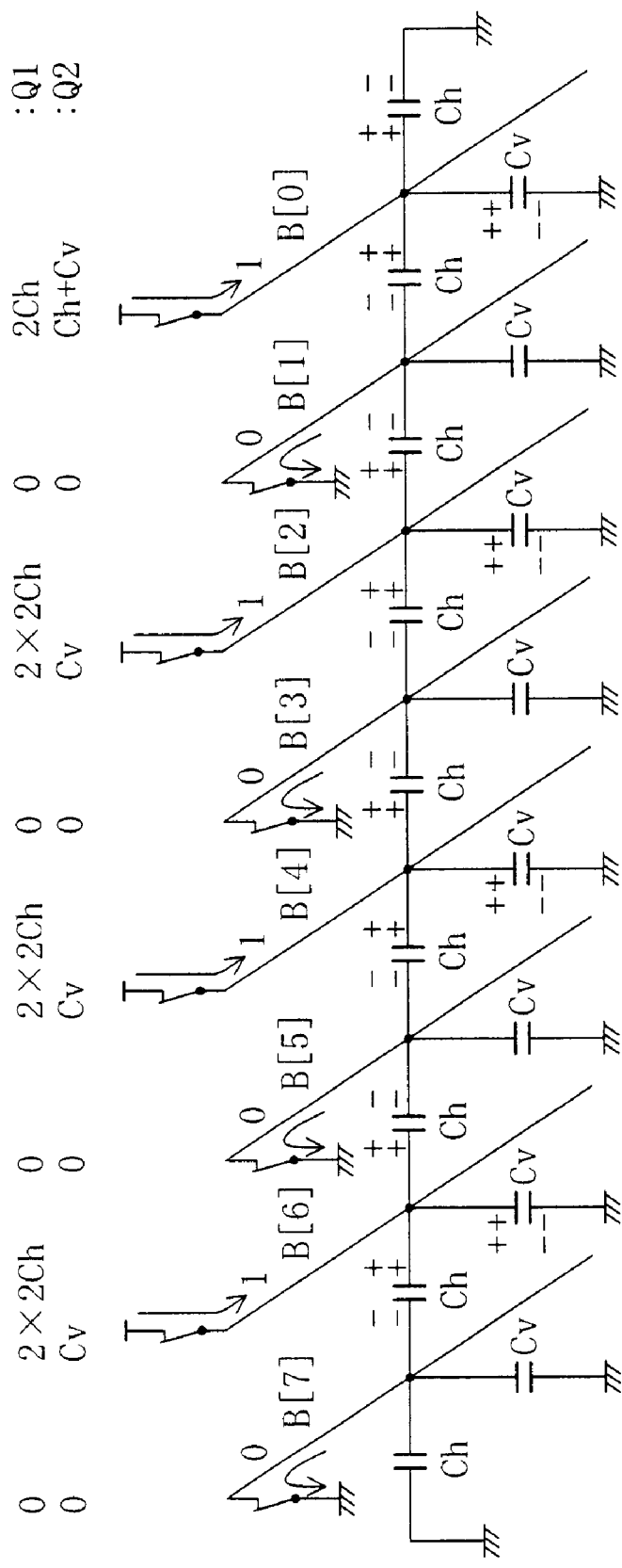
FIG. 18 is a schematic representation illustrating how charges are stored on the stray capacitances shown in FIG. 16 for another data pattern "55".

The charge storage states shown in FIGS. 5 and 7 for the patterns "AA" and "55" are the same as those illustrated in FIGS. 17 and 18, respectively, and the description thereof will be omitted herein.

In the bus lines B[7] through B[0] that are electrically disconnected from the power supply, each adjacent pair of bus lines is shortcircuited with each other in the equalize interval shown in FIG. 6. As a result, the charges, which have been stored on the horizontal capacitance Ch between two adjacent bus lines, are neutralized and disappear. In addition, charges are redistributed among the horizontal capacitance Ch between the bus line B[7] representing the MSB and the ground GND on the left-hand side thereof, the horizontal capacitance Ch between the bus line B[0] representing the LSB and the ground GND on the right-hand side thereof and all the vertical capacitances Cv. Consequently, each of the eight bus lines B[7] through B[0] comes to have a potential of 0.5 V. This change in charge storage state is characterized in that (1) no charges supplied from the power supply affect this potential variation and that (2) the charges, stored on each horizontal capacitance Ch between two adjacent bus lines, are neutralized and disappear. The solid-line arrows shown in FIG. 6 indicate the directions in which main currents flow during this equalize interval. The dashed-line arrow does not indicate that the charges move from the leftmost capacitance to the rightmost capacitance but that the charges move rightward as a whole.

The charge storage state during the equalize interval for the data pattern "55" as shown in FIG. 8 is almost the same as that shown in FIG. 6 except the directions of the currents flowing before the potential levels are equalized with each other.

Next, the quantities Q1 and Q2 of charges, supplied from the power supply while the patterns "AA" and "55" are alternately transmitted, will be described. The transition of the state shown in FIG. 18 into that shown in FIG. 17 for the prior art corresponds to the transition of the state shown in FIG. 8 into that shown in FIG. 5 for this embodiment. Also, the transition of the state shown in FIG. 17 into that shown in FIG. 18 for the prior art corresponds to the transition of the state shown in FIG. 6 into that shown in FIG. 7 for this embodiment. As for the transition of the state shown in FIG. 5 into that shown in FIG. 6 or the transition of the state shown in FIG. 7 into that shown in FIG. 8 for this embodiment, $Q1=Q2=0$.

First, the quantity Q1 of charges supplied to each capacitance between two adjacent bus lines will be considered. For example, on the horizontal capacitance Ch between the two adjacent bus lines B[7] and B[6], no charges are stored in the equalize interval shown in FIG. 8. However, in the bus drive interval for the pattern "AA", a charge quantity $Ch \times 1$ V (with positive charges located on the left-hand side) is stored there as shown in FIG. 5. To change the charge quantity this way, the bus driver 11 should supply charges in the quantity $Ch \times 1$ V to the bus line B[7] before those patterns are transmitted once successfully. The second leftmost bus line B[6] is sandwiched between the bus lines B[7] and B[5] that change their logical states alternately. Accordingly, the bus line B[6] should be supplied with twice the quantity of charges. Consequently, the total quantity of charges supplied from the power supply to the capacitances Ch between adjacent bus lines while the two patterns are transmitted once (i.e., during two data transfer cycles) is $\{(8-1) \times 2Ch\} \times 1$ V.

Next, the quantity Q2 of charges stored elsewhere (i.e., not between two adjacent bus lines) will be described. As for the bus line B[7], for example, a voltage of 0.5 V is applied to, and a charge quantity of $Cv/2$ is stored on, the vertical capacitance Cv during the equalize interval shown in FIG. 8. On the other hand, during the transmission of the pattern "AA" as shown in FIG. 5, a voltage of 1 V is applied to, and a charge quantity of Cv is stored on, the vertical capacitance Cv thereof. Regarding this bus line B[7], a voltage of 0.5 V is applied to, and a charge quantity of $Cv/2$ is stored on, the horizontal capacitance Ch between this line B[7] and the ground GND during the equalize interval shown in FIG. 8. On the other hand, during the transmission of the pattern "AA" as shown in FIG. 5, a voltage of 1 V is applied to, and a charge quantity of Ch is stored on, the horizontal capacitance Ch thereof. That is to say, as for the bus line B[7], a charge quantity $(Cv+Ch) \times 0.5$ V is supplied from the power supply to, and then discharged from, the capacitance created elsewhere (or not between the bus lines) while the data patterns transmitted make one round in the order of "AA" →"55"→"AA". In this case, the charges stored can be regarded as being recycled unlike the known structure. The same statement is applicable to the vertical capacitance Cv associated with any other bus line and to the horizontal capacitance Ch between the rightmost bus line B[0] and the ground GND, because one of the two electrodes of the capacitance Cv or Ch has a fixed potential level. Consequently, the total quantity of charges supplied from the power supply while the data patterns transmitted make one round (i.e., during two data transfer cycles) is (8×Cv/2+ 2Ch)×1 V.

The foregoing example relates to a bus with a width of 8 bits. But the amount of current dissipated from, or charged to, bus lines when two alternating data patterns are transmitted after the bus lines have had their potential levels equalized is generalized with respect to a bit width N (which is an integer equal to or greater than 3) as follows:

Current dissipated from bus lines $$= \{N \times Cv/4 + Ch/2 + (N-1) \times Ch\} \times VDD \times 1/T$$

$$\approx (N \times Cv/4 + N \times Ch) \times VDD \times 1/T \qquad (3)$$

where T is the signal transfer period and VDD is the voltage of a positive power supply. In Equation (3), N×Cv/4+Ch/2 is a term representing a capacitance associated with the electrode with a fixed potential, (N−1)×Ch is a term representing a capacitance between two adjacent bus lines, N×Cv/4 represents the total vertical capacitance and N×Ch represents the total horizontal capacitance.

As for the current dissipation given by Equation (3), the vertical and horizontal capacitances both halve from the capacitances associated with the known structure as given by Equation (1). The vertical capacitance also halves from the capacitance given by Equation (2). That is to say, the embodiment shown in FIG. 1 can greatly reduce the power dissipated from the bus lines.

In the exemplary data patterns "AA" and "55", the bit values "1" and "0" each occur at the same probability of ½. Accordingly, the potential level on each of the bus lines B[7] through B[0] in the equalize interval, i.e., equalized potential, is half of the supply voltage VDD. As for an arbitrary data pattern, however, the equalized potential will be an intermediate potential closer to either VDD or GND. In the configuration shown in FIG. 1, the CMOS switches 14 are used for the equalizer circuit 13 to turn on or cut off the switches making up the equalizer circuit 13 as intended even if the bus lines have such an intermediate potential. For example, if CMOS inverters are used for the bus receiver 21, then a non-negligible amount of feedthrough current will flow through the CMOS inverters. For that reason, in the system shown in FIG. 1, the input buffers 22 selectively deactivated in the equalize interval are used for the bus receiver 21.

It should be noted that if the bit pattern of a signal to be transmitted through the bus lines B[7] through B[0] is only slightly different from the previous bit pattern, then the equalize operation might increase the power dissipated from the bus lines to the contrary. In that case, the activation and deactivation of the equalizer circuit 13 may be controlled by the drive controller 15a depending on how much the bit pattern of the signal to be transmitted is different from the previous one.

For example, where a memory IP including the equalizer circuit 13 is made as one of function modules for a system LSI, the data pattern dependence of a particular application can be utilized. That is to say, if the number of adjacent bit pairs, each changing into mutually opposite values at a time, is small, then the equalizer circuit 13 may be deactivated. On the other hand, if the number of those bit pairs is not necessarily small, then the equalizer circuit 13 may be activated.

Also, a control bit may be added to each bit of the signal that will be transmitted through the bus lines B[7] through B[0] so that the drive controller 15 can control the activation and deactivation of the equalizer circuit 13 in real time in accordance with the values of the control bits.

Alternatively, just some of the bus lines may have their potential levels equalized. For example, where only several low-order bits change frequently among all bits transmitted through the bus lines, only the bus lines representing those frequently changing bits may have their potential levels equalized.

Figure 9:
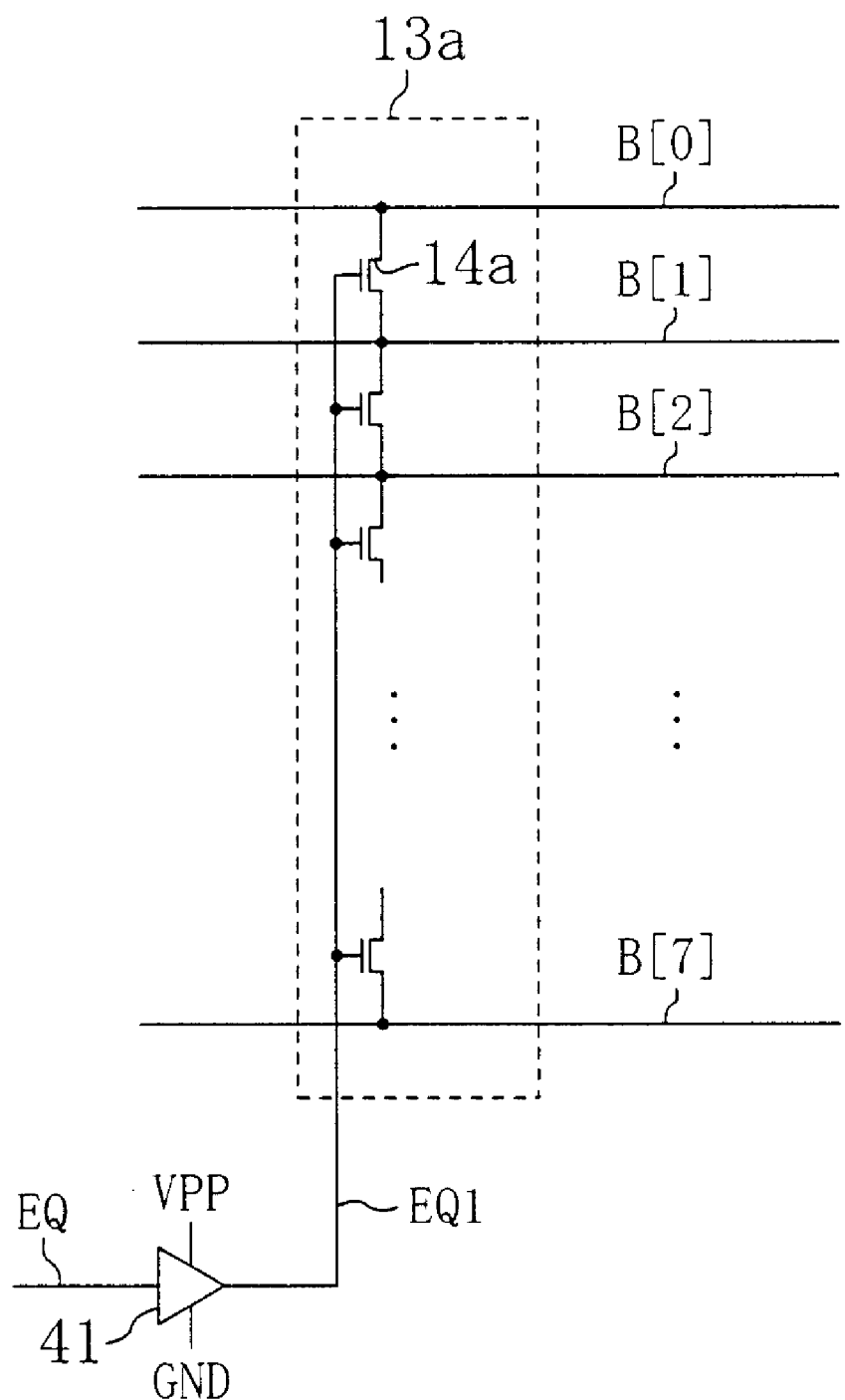
FIG. 9 is a circuit diagram illustrating a first modified example for the equalizer circuit shown in FIG. 1.
Figure 10:
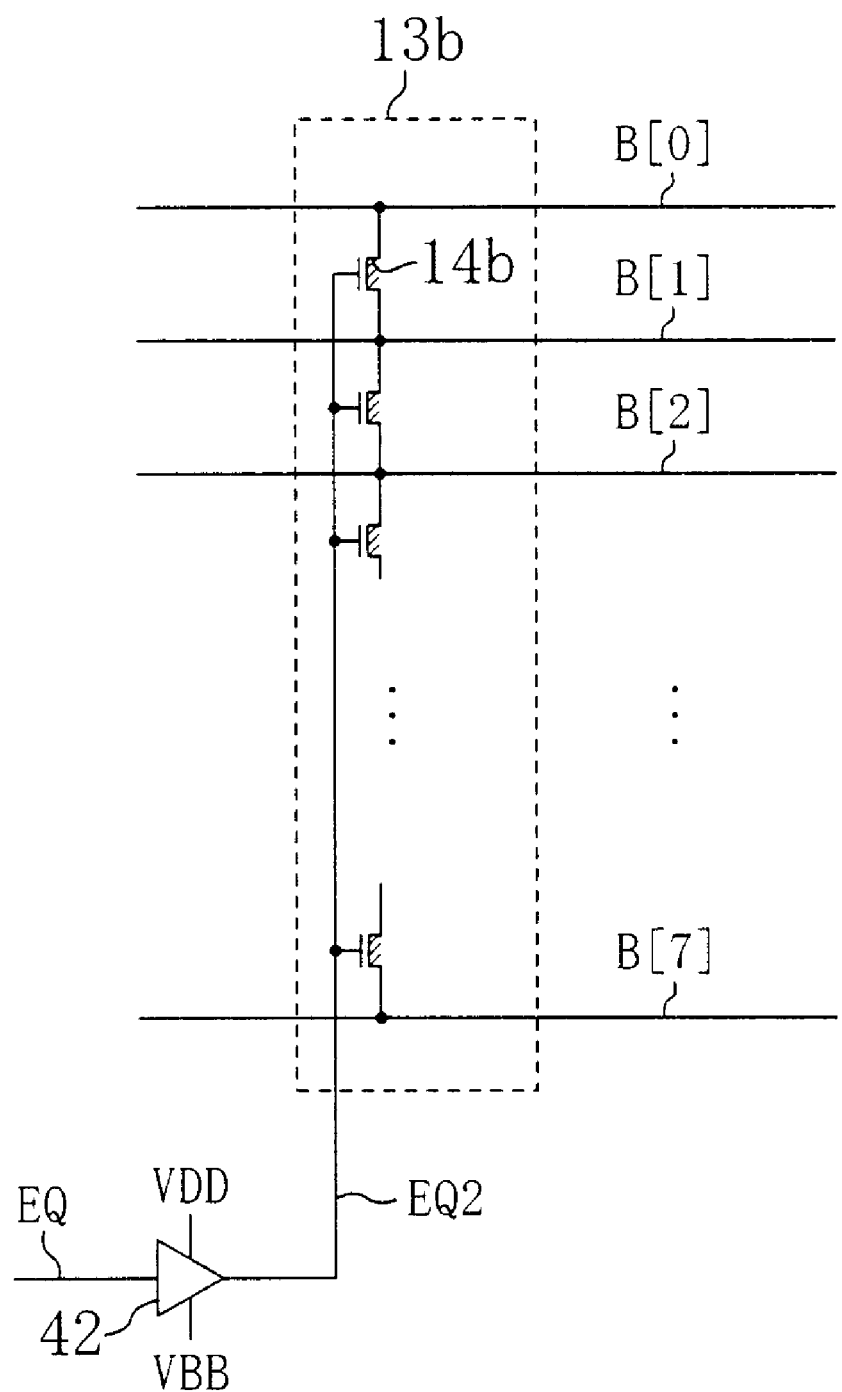
FIG. 10 is a circuit diagram illustrating a second modified example for the equalizer circuit shown in FIG. 1.

Next, modified examples of the equalizer circuit 13 shown in FIG. 1 will be described. FIGS. 9 and 10 illustrate first and second modified examples, respectively.

In the equalizer circuit 13a shown in FIG. 9, each of the seven switches, which is interposed between two adjacent ones of the bus lines B[7] through B[0], is implemented as an enhancement-mode NMOS transistor 14a. A high-level voltage of an equalize signal EQ1 supplied to the gate of each of these NMOS transistors 14a can be increased by a level shifter 41 from the voltage level VDD of the EQ signal to that of a step-up power supply VPP. By utilizing this equalizer circuit 13a, even if the supply voltage VDD is low, each of the NMOS transistors 14a can turn on as intended during the equalize interval.

In the equalizer circuit 13b shown in FIG. 10, each of the seven switches, which is interposed between two adjacent ones of the bus lines B[7] through B[0], is implemented as a depletion-mode NMOS transistor 14b. A low-level voltage of an equalize signal EQ2 supplied to the gate of each of these NMOS transistors 14b can be decreased by a level shifter 42 from the voltage level GND of the EQ signal to that of a negative power supply VBB. By utilizing this equalizer circuit 13b, each of the NMOS transistors 14b can cut off as intended during the bus drive interval. If the signal transmission system is operated as shown in FIG. 4 (i.e., the bus lines B[7] through B[0] always have their potential levels equalized except while the signal is being transmitted), then the amount of leakage current flowing through the equalizer circuit 13b is almost negligible. In that case, the level shifter 42 can be omitted from the circuit shown in FIG. 10.

Figure 11:
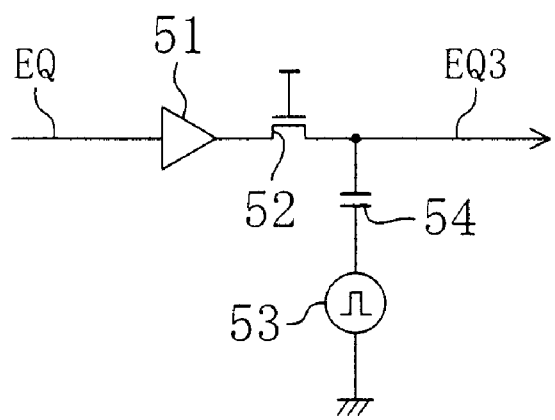
FIG. 11 is a circuit diagram illustrating an exemplary level shifter applicable to the equalizer circuit shown in FIG. 9.

FIG. 11 illustrates an exemplary level shifter 50 applicable to the equalizer circuit 13a shown in FIG. 9. In the level shifter 50 shown in FIG. 11, an n-channel transfer gate 52 is connected to the output of a VDD power supply buffer 51 and to a booting pulse generator 53 and a capacitor 54, thereby generating an equalize signal EQ3 to be supplied to the gates of the NMOS transistors 14a. This level shifter 50 raises the potential level at the node of the EQ3 signal to a high level, charges this node sufficiently and then generates a booting pulse. In this manner, the level shifter 50 can raise the potential level of the EQ3 signal to a level higher than VDD without using the step-up power supply VPP. As a result, the power dissipation can be easily reduced particularly in a standby mode.

Figure 12:
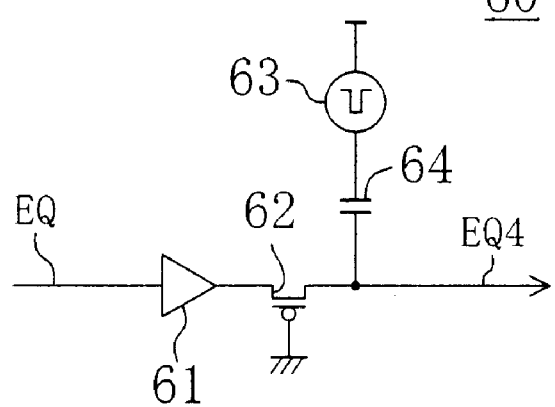
FIG. 12 is a circuit diagram illustrating an exemplary level shifter applicable to the equalizer circuit shown in FIG. 10.

FIG. 12 illustrates an exemplary level shifter 60 applicable to the equalizer circuit 13b shown in FIG. 10. In the level shifter 60 shown in FIG. 12, a p-channel transfer gate 62 is connected to the output of a VDD power supply buffer 61 and to a booting pulse generator 63 and a capacitor 64, thereby generating an equalize signal EQ4 to be supplied to the gates of the NMOS transistors 14b. This level shifter 60 can decrease the potential level of the EQ4 signal to a level lower than GND without using the negative power supply VBB. As a result, the power dissipation can be easily reduced particularly in a standby mode.

In the examples illustrated in FIGS. 9 and 10, the equalizer circuits 13a and 13b are made up of enhancement-mode NMOS transistors 14a and depletion-mode NMOS transistors 14b, respectively. Alternatively, if the polarity of the equalize signals EQ1 and EQ2 is inverted, these NMOS transistors 14a and 14b may be replaced with PMOS transistors.

Figure 13:
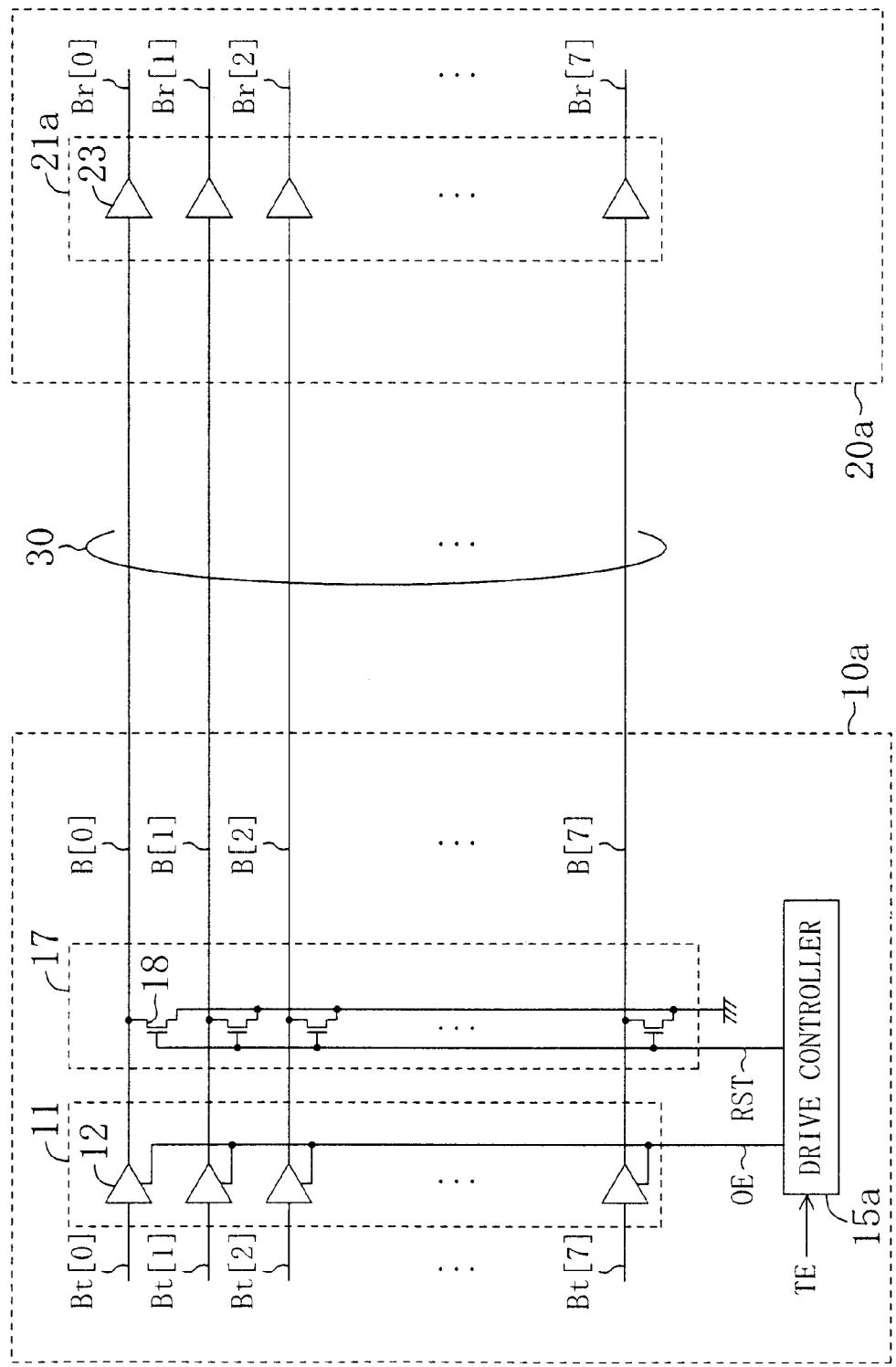
FIG. 13 is a circuit diagram illustrating another exemplary configuration for the inventive signal transmission system.

FIG. 13 illustrates another exemplary configuration for the signal transmission system of the present invention. The system shown in FIG. 13 includes: driver circuit 10a on the transmitting end; receiver circuit 20a on the receiving end; and bus 30 interposed between the driver and receiver circuits 10a and 20a. In the illustrated embodiment, the bus 30 is made up of eight bus lines B[7] through B[0].

The driver circuit 10a includes bus driver 11, reset circuit 17 and drive controller 15a. The bus driver 11 is made up of eight tristate buffers 12, which receive an output enable (OE) signal from the drive controller 15a to drive the bus lines B[7] through B[0] in accordance with the data Bt[7] through Bt[0] to be transmitted. Before a signal is transmitted from the driver circuit 10a to the receiver circuit 20a by way of the bus 30, the reset circuit 17 resets the potential levels on the bus lines B[7] through B[0] to a low (i.e., GND) level. The reset circuit 17 includes seven NMOS transistors 18 as switches. Each of these NMOS transistors 18 has its drain connected to associated one of the bus lines B[7] through B[0], has its source potential fixed at the GND level and receives a reset (RST) signal at its gate from the drive controller 15a. On receiving a transmission enable (TE) signal, the drive controller 15a generates the OE and RST signals.

To obtain received data Br[7] through Br[0] from the signal that has been transmitted through the bus lines B[7] through B[0], the receiver circuit 20a includes a bus receiver 21a made up of eight input buffers 23.

Figure 14:
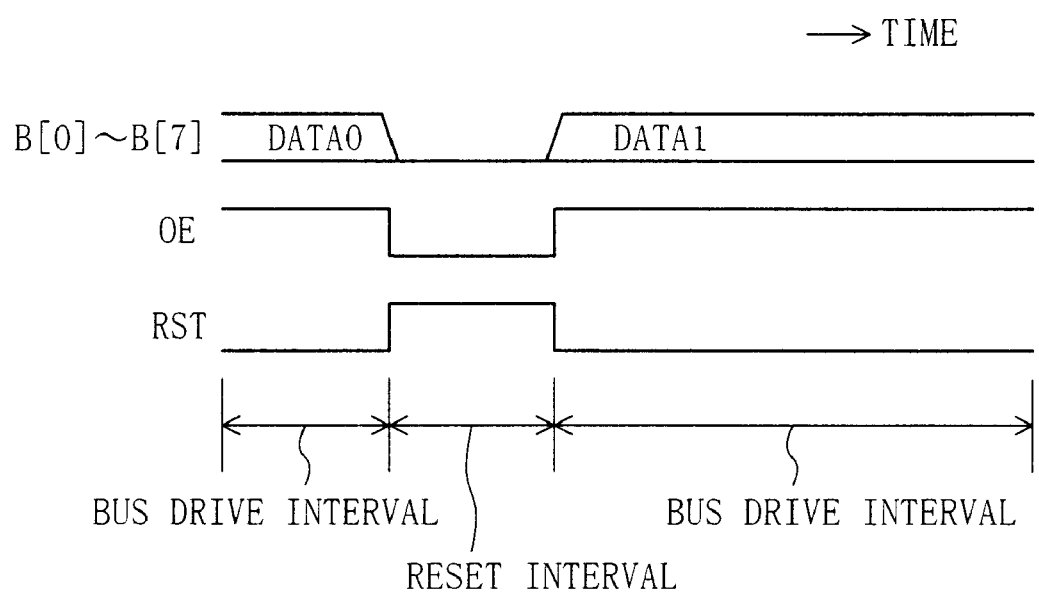
FIG. 14 is a timing diagram illustrating how the system shown in FIG. 13 may operate.

FIG. 14 is a timing diagram illustrating how the system shown in FIG. 13 may operate. As shown in FIG. 14, before the data DATA0 transmitted through the bus lines B[7] through B[0] is replaced with another data DATA1, the OE signal is negated to make the outputs of the tristate buffers 12 on the transmitting end have a high impedance. Then, the RST signal is asserted to activate the reset circuit 17. Once the bus lines B[7] through B[0] have their potential levels reset to the GND level, the RST signal will be negated and instead the OE signal will be asserted. Then, the bus lines are ready to be driven and DATA1 is ready to be received.

In the system shown in FIG. 13, the potential levels on the bus lines B[7] through B[0] are all reset to the GND level during the reset interval. As a result, the charges that have been stored on the horizontal and vertical capacitances Ch and Cv associated with these bus lines are all discharged. That is to say, no charges stored are recyclable for the capacitances Ch and Cv that were not created between adjacent bus lines. Thus, an increased quantity of charges should be supplied thereto from the power supply compared to the embodiment shown in FIG. 1. However, the quantity of charges supplied from the power supply to each capacitance Ch between adjacent bus lines can also be reduced as in the embodiment shown in FIG. 1. Overall, the embodiment shown in FIG. 13 can also reduce the power dissipated from the bus lines compared to the known structure.

Unlike the equalizer circuit 13a shown in FIG. 9, none of the NMOS transistors 18 in the reset circuit 17 shown in FIG. 13 is supplied with a raised gate voltage. This configuration is realized because each of the NMOS transistors 18 shown in FIG. 13 has its source potential fixed at the GND level. Also, in the system shown in FIG. 13, the potential levels on the bus lines B[7] through B[0] do not decrease to any intermediate potential (e.g., VDD/2) during any interval including the reset interval. Accordingly, even if the input buffers 23 on the receiving end are implemented as CMOS inverters, the buffers 23 do not have to be deactivated during the reset interval.

If the bit pattern of a signal to be transmitted through the bus lines B[7] through B[0] is only slightly different from the previous bit pattern, then the reset operation might increase the power dissipated from the bus lines to the contrary. In that case, the activation and deactivation of the reset circuit 17 may be controlled by the drive controller 15a depending on how much the bit pattern of the signal to be transmitted is different from the previous one.

Where a memory IP including the reset circuit 17 is made as one of function modules for a system LSI, the data pattern dependence of a particular application can be utilized. That is to say, if the number of adjacent bit pairs, each changing into mutually opposite values at a time, is small, then the reset circuit 17 may be deactivated. On the other hand, if the number of those bit pairs is not necessarily small, then the reset circuit 17 may be activated.

Also, a control bit may be added to each bit of the signal that will be transmitted through the bus lines B[7] through B[0] so that the drive controller 15a can control the activation and deactivation of the reset circuit 17 in real time in accordance with the values of the control bits.

Alternatively, just some of the bus lines may have their potential levels reset to the low level. For example, where only several low-order bits change frequently among all bits transmitted through the bus lines, only the bus lines representing those frequently changing bits may have their potential levels reset.

Figure 15:
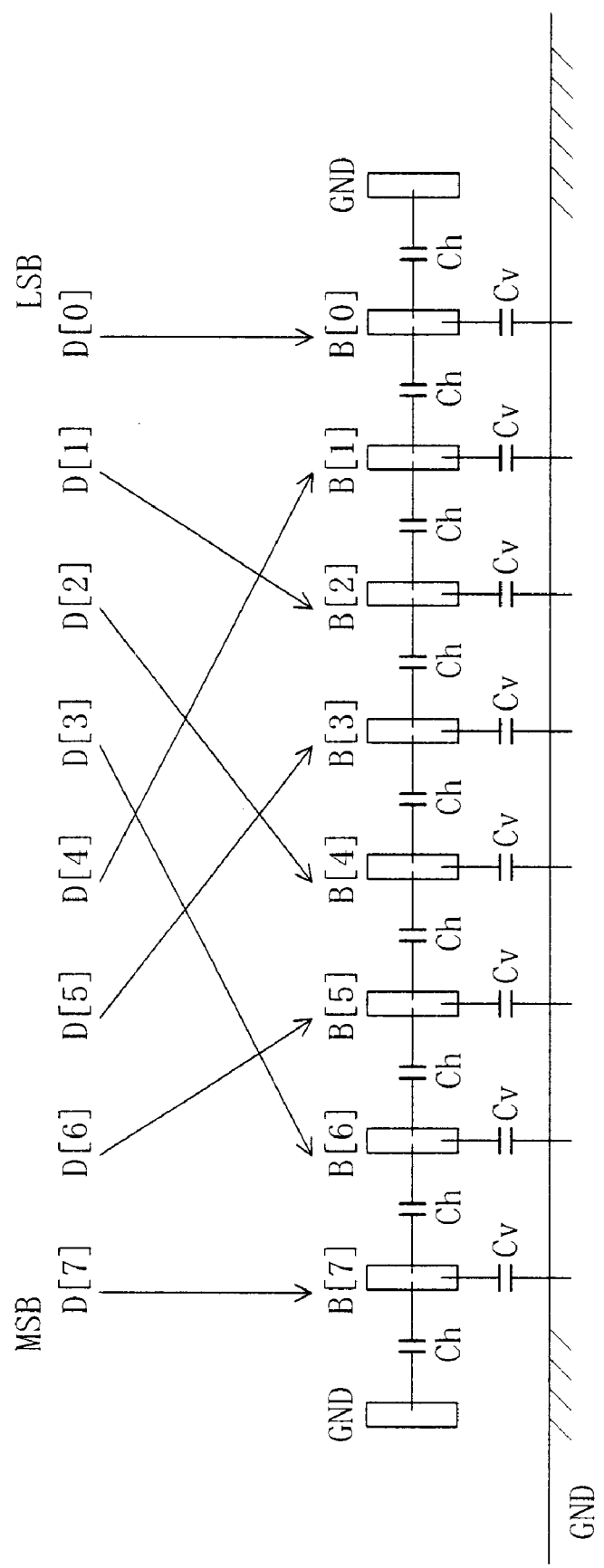
FIG. 15 is a schematic representation illustrating a third exemplary configuration for the inventive signal transmission system.

FIG. 15 illustrates a third exemplary configuration for the inventive signal transmission system. The system shown in FIG. 15 also includes: a driver circuit on the transmitting end; a receiver circuit on the receiving end; and eight bus lines B[7] through B[0] interposed between the driver and receiver circuits. In this system, the bus lines B[7] through B[0] are so arranged as to reduce the number of adjacent bit pairs, each changing into mutually opposite values at a time. Specifically, first, the bit sequence D[7] through D[0] of the signal to be transmitted is divided into a high-order sequence D[7] through D[4] and a low-order sequence D[3] through D[0]. In the example illustrated in FIG. 15, the bus lines B[7] through B[0] are so arranged that one of the bus lines that is associated with the high-order sequence D[7] through D[4] alternates with another one of the bus lines that is associated with the low-order sequence D[3] through D[0]. Specifically, B[7]=D[7], B[6]=D[3], B[5]=D[6], B[4]=D[2], B[3]=D[5], B[2]=D[1], B[1]=D[4] and B[0]=D[0].

For example, where the low-order four bits D[3] through D[0] of audiovisual data change much more frequently than the high-order four bits D[7] through D[4] thereof, the bus lines B[7] through B[0] may be rearranged as shown in FIG. 15. In that case, the potential levels on two adjacent bus lines much less likely change in mutually opposite phases compared to non-rearranged bus lines. As a result, the power dissipated from the bus lines can be reduced.

In the foregoing description of the present invention, the number of bus lines is supposed to be eight. It should be understood, however, that the present invention is broadly applicable to any signal transmission system including any other arbitrary number of bus lines so long as the number is three or more.

What is claimed is:

1. A signal transmission system comprising:
   a driver circuit on the transmitting end;
   a receiver circuit on the receiving end;

three or more bus line interposed between the driver the receiver circuits; and an equalizer circuit for equalizing potential levels on the bus line with each other while the bus line are electrically disconnected from any power supply before a signal is transmitted from the driver circuit to the receiver circuit by way of the bus line.

2. The system of claim 1, wherein the equalizer circuit comprises at least two switches, each of which is interposed between two adjacent ones of the bus lines, and wherein the switches are controlled in such a manner as to turn on while the bus lines have their potential levels equalized and to cut off while the bus lines do not have their potential levels equalized but are being driven.

3. The system of claim 2, wherein each said switch is a CMOS switch made up of p- and n-channel MOS transistors.

4. The system of claim 2, wherein each said switch is an enhancement-mode MOS transistor, and wherein while the bus lines have their potential levels equalized, each said MOS transistor receives, at its gate, a voltage that has been raised to a level high enough to turn the MOS transistor on.

5. The system of claim 2, wherein each said switch is a depletion-mode MOS transistor, and wherein while the bus lines are being driven, each said MOS transistor receives, at its gate, a voltage at such a level as cutting the MOS transistor off.

6. The system of claim 1, wherein the bus lines always have their potential levels equalized except while the signal is being transmitted through the bus lines.

7. The system of claim 1, further comprising a control line for transmitting a signal, representing an interval in which the bus lines have their potential level equalized, from the driver circuit to the receiver circuit.

8. The system of claim 1, wherein the receiver circuit comprises at least three input buffers, which are deactivated while the bus lines have their potential levels equalized.

9. The system of claim 1, further comprising means for activating and deactivating the equalizer circuit adaptively in accordance with a change in bit pattern of the signal to be transmitted through the bus lines.

10. The system of claim 9, wherein the equalizer circuit is deactivated if the number of adjacent bit pairs, each changing into mutually opposite values at a time, is small.

11. The system of claim 9, wherein the equalizer circuit is activated if the number of adjacent bit pairs, each changing into mutually opposite values at a time, is not necessarily small.

12. The system of claim 1, wherein a control bit is added to each bit of the signal that will be transmitted through the bus lines, and wherein activation and deactivation of the equalizer circuit is controlled in real time in accordance with values of the control bits.

13. The system of claim 1, wherein the equalizer circuit equalizes the potential levels on only some of the bus lines with each other.

14. A signal transmission system comprising:

a driver circuit on the transmitting end;

a receiver circuit on the receiving end;

three or more bus lines interposed between the driver and receiver circuits; and a reset circuit for resetting potential levels on the bus lines to a low level before a signal is transmitted from the driver circuit to the receiver circuit by way of the bus lines.

15. The system of claim 14, further comprising means for activating and deactivating the reset circuit adaptively in accordance with a change in bit pattern of the signal to be transmitted through the bus lines.

16. The system of claim 15, wherein the reset circuit is deactivated if the number of adjacent bit pairs, each changing into mutually opposite values at a time, is small.

17. The system of claim 15, wherein the reset circuit is activated if the number of adjacent bit pairs, each changing into mutually opposite values at a time, is not necessarily small.

18. The system of claim 14, wherein a control bit is added to each bit of the signal that will be transmitted through the bus lines, and wherein activation and deactivation of the reset circuit is controlled in real time in accordance with values of the control bits.

19. The system of claim 14, wherein the reset circuit resets the potential levels on only some of the bus lines.

20. A signal transmission system comprising:

a driver circuit on the transmitting end;

a receiver circuit on the receiving end; and three or more bus lines interposed between the driver and receiver circuits, wherein the bus lines are so arranged as to reduce the number of adjacent bit pairs, each changing into mutually opposite values at a time.

21. The system of claim 20, wherein a bit sequence of the signal to be transmitted through the bus lines is divided into high- and low-order sequences, and wherein the bus lines are so arranged that one of the bus lines that is associated with the high-order sequence alternates with another one of the bus lines that is associated with the low-order sequence.

* * * * *

UNITED STATES PATENT AND TRADEMARK OFFICE
CERTIFICATE OF CORRECTION

PATENT NO.    : 6,600,336 B2
DATED         : July 29, 2003
INVENTOR(S)   : Makoto Kojima It is certified that error appears in the above-identified patent and that said Letters Patent is hereby corrected as shown below:

<u>Column 13,</u>
Lines 1 and 7, change "line" to -- lines --
Line 4, change (first and second) "line" to -- lines --

Signed and Sealed this

Second Day of March, 2004

JON W. DUDAS
*Acting Director of the United States Patent and Trademark Office*